(12) United States Patent
Woo et al.

(10) Patent No.: US 11,094,678 B2
(45) Date of Patent: *Aug. 17, 2021

(54) LIGHT EMITTING DEVICE HAVING INSULATION PATTERN

(71) Applicant: SAMSUNG DISPLAY CO., LTD., Yongin-si (KR)

(72) Inventors: Yeoung Keol Woo, Seoul (KR); Chul Min Bae, Hwaseong-si (KR); Heon Sik Ha, Osan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/833,291

(22) Filed: Mar. 27, 2020

(65) Prior Publication Data
US 2020/0227392 A1 Jul. 16, 2020

Related U.S. Application Data

(63) Continuation of application No. 15/927,678, filed on Mar. 21, 2018, now Pat. No. 10,607,968.

(30) Foreign Application Priority Data

Sep. 22, 2017 (KR) .......................... 10-2017-0122625

(51) Int. Cl.
*H01L 33/62* (2010.01)
*H01L 25/075* (2006.01)
(Continued)

(52) U.S. Cl.
CPC .......... *H01L 25/0753* (2013.01); *H01L 24/96* (2013.01); *H01L 33/62* (2013.01);
(Continued)

(58) Field of Classification Search
CPC ......... H01L 33/36; H01L 33/38; H01L 33/46; H01L 33/60; H01L 33/62; H01L 33/382;
(Continued)

(56) References Cited

U.S. PATENT DOCUMENTS 8,674,387 B2 * 3/2014 Sanga ...................... H01L 33/60
257/98
9,209,371 B2 * 12/2015 Huang ..................... H01L 33/62
(Continued)

FOREIGN PATENT DOCUMENTS

| JP | 2011-103435 A | 5/2011 |
| JP | 2011-205060 A | 10/2011 |

(Continued)

*Primary Examiner* — Khiem D Nguyen
(74) *Attorney, Agent, or Firm* — Lewis Roca Rothgerber Christie LLP

(57) ABSTRACT

A light emitting device includes: a substrate; a first electrode and a second electrode on the substrate and spaced apart from each other; a light emitting diode between the first electrode and the second electrode and connected to the first and second electrodes; a first contact on the first electrode; and a second contact on the second electrode. The first contact contacts the first electrode and a first portion of the light emitting diode, and the second contact contacts the second electrode and a second portion of the light emitting diode.

14 Claims, 12 Drawing Sheets

(51) Int. Cl.
*H01L 23/00* (2006.01)
*H01L 33/38* (2010.01)

(52) U.S. Cl.
CPC .... *H01L 33/38* (2013.01); *H01L 2224/95101* (2013.01); *H01L 2224/95133* (2013.01); *H01L 2933/0066* (2013.01)

(58) Field of Classification Search
CPC . H01L 33/387; H01L 33/486; H01L 25/0753; H01L 33/0753
See application file for complete search history.

(56) References Cited

U.S. PATENT DOCUMENTS

| | | | |
|---|---|---|---|
| 9,334,573 B2 * | 5/2016 | Higashiuchi | C23F 11/182 |
| 9,653,661 B2 * | 5/2017 | Suehiro | H01L 24/97 |
| 10,607,968 B2 * | 3/2020 | Woo | H01L 24/96 |
| 2007/0194322 A1 | 8/2007 | Sung et al. | |
| 2008/0029780 A1 | 2/2008 | Ohtsuka et al. | |
| 2008/0299787 A1 | 12/2008 | Chung et al. | |
| 2009/0078956 A1 * | 3/2009 | Tseng | H01L 33/641 257/98 |
| 2009/0243504 A1 | 10/2009 | Cho et al. | |
| 2012/0012881 A1 | 1/2012 | Lee et al. | |
| 2013/0113003 A1 | 5/2013 | Ke et al. | |
| 2013/0292812 A1 | 11/2013 | Seo et al. | |
| 2013/0313585 A1 | 11/2013 | Jung et al. | |
| 2014/0319564 A1 | 10/2014 | Lin et al. | |
| 2016/0079507 A1 | 3/2016 | Lee et al. | |
| 2018/0019385 A1 * | 1/2018 | Chen | H01L 33/641 |

FOREIGN PATENT DOCUMENTS

| | | |
|---|---|---|
| KR | 10-1436123 | 8/2014 |
| KR | 10-1628345 | 6/2016 |
| KR | 10-1730977 | 4/2017 |
| KR | 10-2017-0072669 | 6/2017 |

* cited by examiner

# LIGHT EMITTING DEVICE HAVING INSULATION PATTERN

CROSS-REFERENCE TO RELATED APPLICATIONS

This application is a continuation of U.S. patent application Ser. No. 15/927,678, filed Mar. 21, 2018, issued as U.S. Pat. No. 10,607,968, which claims priority to and the benefit of Korean Patent Application No. 10-2017-0122625, filed Sep. 22, 2017, the entire content of both of which is incorporated herein by reference.

BACKGROUND

1. Field

The described technology relates generally to a light emitting device and a method of manufacturing the same.

2. Description of the Related Art

In general, a light emitting diode is an element that emits light (e.g., light having a certain or predetermined wavelength) corresponding to an electric signal received through electrodes that are respectively connected to opposite ends of the light emitting diode.

Recently, a light emitting device in which nano-sized light emitting diodes are sprayed on neighboring electrodes by using a spray device, such as an inkjet printer, and are then aligned on the electrodes by forming an electric field between the electrodes has been researched and developed.

The above information disclosed in this Background section is for enhancement of understanding of the background of the described technology, and therefore, it may contain information that does not form prior art.

SUMMARY

The described technology may prevent (or reduce the occurrence of) a short circuit occurring between two electrodes on a substrate during alignment of the light emitting diodes due to the presence of unintended or undesired particles.

Further, embodiments of the present invention provide a light emitting device in which a number of light emitting diodes provided between two electrodes is increased, and a method of manufacturing the same.

One embodiment of the present invention provides a light emitting device including: a substrate; a first electrode and a second electrode on the substrate and spaced apart from each other; a light emitting diode between the first electrode and the second electrode; a first contact on the first electrode; and a second contact on the second electrode. The light emitting diode is connected to the first electrode and the second electrode, the first contact contacts the first electrode and a first portion of the light emitting diode, and the second contact contacts the second electrode and a second portion of the light emitting diode.

The light emitting device may further include an insulation pattern between the first contact and the second contact.

The insulation pattern may contact the first contact, the second contact, and the light emitting diode.

The insulation pattern may be a single layer.

The insulation pattern may completely cover the first electrode.

The insulation pattern may partially cover the first electrode.

The first contact may not extend beyond the first electrode and the light emitting diode.

The light emitting diode may include a plurality of light emitting diodes, and the plurality of light emitting diodes may be connected to the first electrode and the second electrode.

The plurality of light emitting diodes may include first light emitting diodes, and at least one of first and second ends of each of the first light emitting diodes may contact at least one of the first electrode or the second electrode.

The plurality of light emitting diodes may include second light emitting diodes, and one end and another end of each of the second light emitting diodes may contact the substrate.

The light emitting device may further include a first protrusion between the substrate and the second electrode.

The light emitting device may further include a second protrusion between the substrate and the first electrode.

Another embodiment of the present invention provides a method of manufacturing a light emitting device. The method includes: coating a plurality of light emitting diodes on a first electrode and a second electrode; aligning the plurality of light emitting diodes between the first electrode and the second electrode by forming an electric field between the first electrode and the second electrode; forming a first contact layer covering the first electrode, the second electrode, and the plurality of light emitting diodes; forming a first contact contacting the first electrode and a first portion of the light emitting diode by etching the first contact layer using a mask; and forming a second contact contacting the second electrode and a second portion of the light emitting diode. The first and second electrodes are spaced apart from each other on a substrate.

The method may further include forming an insulation pattern between the first contact and the second contact.

The forming of the first contact may include removing particles formed on the substrate and contacting the first contact layer.

A light emitting device in which a number of light emitting diodes provided between two electrodes is increased and a method of manufacturing the same is be provided.

DETAILED DESCRIPTION

Figure 1:
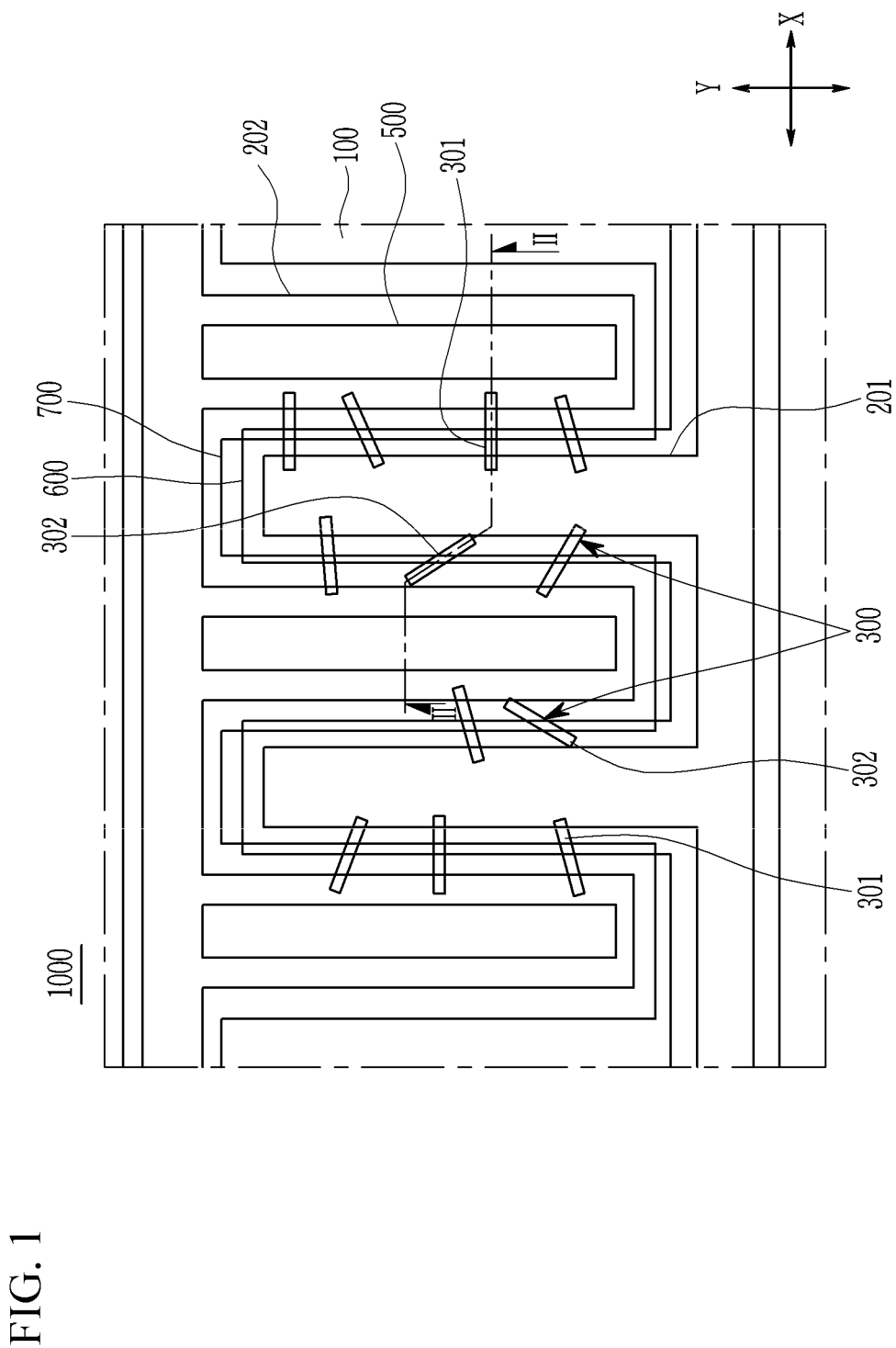
FIG. 1 is a top plan view of a light emission device according to an exemplary embodiment.

Hereinafter, exemplary embodiments of the present invention will be described in more detail with reference to the accompanying drawings. The present invention, however, may be embodied in various different forms and should not be construed as being limited to the exemplary embodiments illustrated herein.

The drawings and description are to be regarded as illustrative in nature and not restrictive. Like reference numerals designate like elements throughout the specification.

In addition, the size and thickness of each configuration shown in the drawings may be arbitrarily shown for better understanding and ease of description, and the present invention is not limited thereto. For example, in the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present. When an element is referred to as being "directly on" another element, there are no intervening elements present. Further, the word "over" or "on" means positioning on or below the object portion and does not essentially mean positioning on the upper side of the object portion based on a gravity direction.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

In addition, unless explicitly described to the contrary, the word "include" and "comprise" and variations thereof, such as "includes," "including," "comprises," and/or "comprising" will be understood to imply the inclusion of stated elements but not the exclusion of any other elements.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Hereinafter, a light emitting diode (LED) display according to an exemplary embodiment will be described with reference to FIGS. 1 and 2.

FIG. 1 is a top plan view of a light emitting diode display according to an exemplary embodiment. FIG. 2 is a cross-sectional view taken along the line II-II of FIG. 1.

Figure 2:
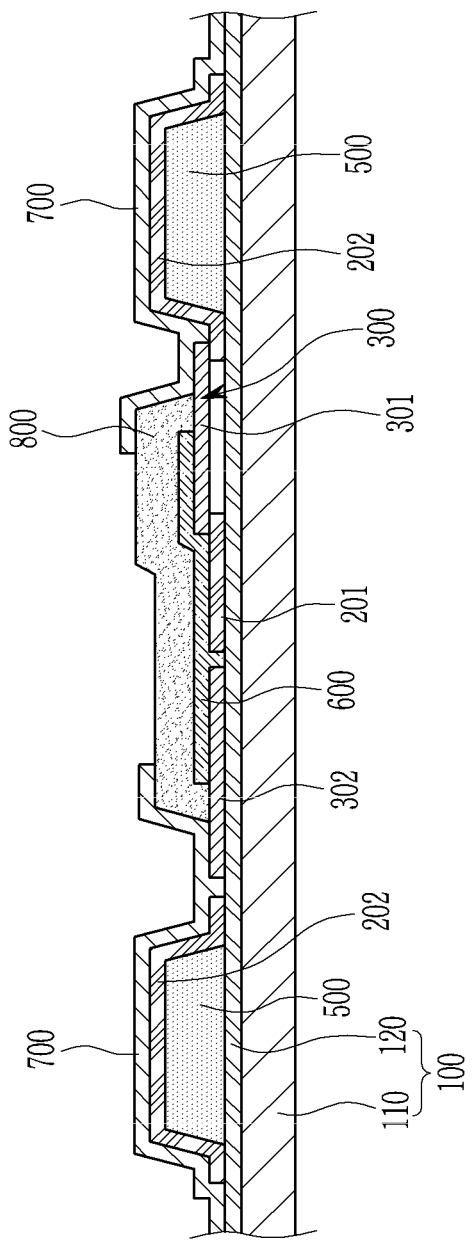
FIG. 2 is a cross-sectional view taken along the line II-II of FIG. 1.

Referring to FIGS. 1 and 2, a light emitting device according to an exemplary embodiment that emits light by using a plurality of nano-sized light emitting diodes is illustrated.

The light emitting device 1000 includes a substrate 100, a first electrode 201, a second electrode 202, a plurality of light emitting diodes 300, a first protrusion (e.g., a first protrusion portion) 500, a first contact (e.g., a first contact portion) 600, a second contact (e.g., a second contact portion) 700, and an insulation pattern 800.

The substrate 100 may include (or may be formed of) at least one of glass, an organic material, an inorganic material, a metal, or the like. The substrate 100 may be flexible, foldable, or bendable. The substrate 100 includes a substrate main body 110 and a buffer layer 120 that is disposed on the substrate main body 110. The substrate main body 110 may include (or may be formed of) at least one of the above-stated glass, organic material, inorganic material, or metal. The buffer layer 120 may be disposed on the entire surface (e.g., the entire upper surface) of the substrate main body 110. The buffer layer 120 may include (or may be formed of) at least one of glass, an organic material, an inorganic material, or the like.

The first electrode 201 is disposed on the substrate 100, extends (e.g., primarily extends) in a first direction X, and is branched a plurality of times in a second direction Y that crosses the first direction X.

The second electrode 202 is disposed on the substrate 100 and is separated or spaced from the first electrode 201. The second electrode 202 extends in the first direction X while being branched a plurality of times in the second direction Y.

The first electrode 201 and the second electrode 202 are alternately disposed or arranged along the first direction X.

The first electrode 201 and the second electrode 202 respectively have straight-line shapes (e.g., straight or substantially straight edges), but the present invention is not limited thereto. The first electrode 201 and the second electrode 202 may have curved-line shapes.

The first electrode 201 and the second electrode 202 are disposed on a same plane (e.g., at a same level) on the substrate 100, but the present invention is not limited thereto. The first electrode 201 and the second electrode 202 may be disposed on different planes on the substrate 100.

The first electrode 201 and the second electrode 202 may be concurrently (or simultaneously) formed through one process, but the present invention is not limited thereto. They may be sequentially formed through different processes.

The plurality of light emitting diodes 300 are disposed between (e.g., are disposed to extend between) the first electrode 201 and the second electrode 202. The plurality of light emitting diodes 300 are connected to the first electrode 201 and the second electrode 202.

The plurality of light emitting diodes 300 are substantially nano-sized. For example, the light emitting diodes 300 may be approximately 12 microns long The plurality of light emitting diodes 300 may include various known light emitting diodes included in a light emitting device, but the present invention is not limited thereto. Any suitable ones of various known light emitting diodes included in a display device can be used.

Each of the plurality of light emitting diodes 300 may have one of various shapes, such as a cylindrical, a triangular column, a quadrangular column, conical, and the like.

The plurality of light emitting diodes 300 are coated on the first electrode 201 and the second electrode 202 in solution by a coating device, such as an inkjet printer, and may then be arranged between the first electrode 201 and the second electrode 202 by an electromagnetic field formed between the first electrode 201 and the second electrode 202.

Here, the solution may be an ink or paste in which the plurality of light emitting diodes 300 are mixed in a solvent.

Each of the plurality of light emitting diodes 300 has an aspect ratio, and the light emitting diodes 300 are aligned in various suitable directions (e.g., various suitable directions with respect to the first and second directions X and Y) between the first electrode 201 and the second electrode 202.

The plurality of light emitting diodes 300 includes first light emitting diodes 301 and second light emitting diodes 302.

At least one of a first end or a second end of the first light emitting diode 301 contacts at least one of the first electrode 201 or the second electrode 202. For example, at least one of opposite ends of each first light emitting diode 301 is disposed on at least one of the first electrode 201 and the second electrode 202, and each first light emitting diode 301 overlaps at least one of the first electrode 201 and the second electrode 202.

A first end and a second end of the second light emitting diode 302 contact the substrate 100. For example, opposite ends of the second light emitting diode 302 contact the substrate 100, and the second light emitting diode 302 does not overlap either the first electrode 201 or the second electrode 202.

The first protrusion 500 is disposed between the substrate 100 and the second electrode 202. The first protrusion 500 protrudes upwardly from a surface of the substrate 100. A portion of the second electrode 202 that is disposed on the surface of the first protrusion 500 protrudes upwardly.

Light emitted from the plurality of light emitting diodes 300 and irradiated in a direction toward the first protrusion 500 may be reflected in a top side direction (e.g., in a direction away from the substrate 100) by the portion of the second electrode 202 that protrudes due to the first protrusion 500. Accordingly, light emission efficiency of the plurality of light emitting diodes 300 may be improved.

The first contact 600 is disposed on the first electrode 201, and contacts the first electrode 201 and a first portion of the plurality of light emitting diodes 300. The first contact 600 may include a transparent conductive material, but the present invention is not limited thereto. In the illustrated embodiment, the first portion of the light emitting diode 300 is one end of the light emitting diodes 300.

In some embodiments, the entire first contact 600 contacts the first electrode 201 or the light emitting diode 300 (e.g., the first contact 600 does not extend beyond the first electrode 201 and the light emitting diode 300).

The second contact 700 is disposed on the second electrode 202, and contacts the second electrode 202 and a second portion of the plurality of light emitting diodes 300. The second contact 700 may include a transparent conductive material, but the present invention is not limited thereto. In the illustrated embodiment, the second portion of the light emitting diodes 300 is the other end of the light emitting diode 300.

A portion of the first contact 600 and a portion of the second contact 700 overlap each other on the plurality of light emitting diodes 300.

The plurality of light emitting diodes 300 disposed between the first electrode 201 and the second electrode 202 are connected to the first electrode 201 and the second electrode 202 via the first contact 600 and the second contact 700.

For example, the first light emitting diode 301 from among the plurality of light emitting diodes 300 may be directly connected to the first electrode 201 and the second electrode 202 by contacting the first electrode 201 and the second electrode 202, respectively, or may be indirectly connected to the first electrode 201 and the second electrode 202. However, because the second contact 700 contacts the second electrode 202 and the first portion of the second light emitting diode 302 and the first contact 600 contacts the first electrode 201 and the second portion of the second light emitting diode 302, the second light emitting diode 302 is connected with the first electrode 201 and the second electrode 202.

Because the plurality of light emitting diodes 300 are connected to the first electrode 201 and the second electrode 202 by the first contact 600 and the second contact 700, the plurality of light emitting diodes 300 are connected to the first electrode 201 and the second electrode 202 even though some of the light emitting diodes 300 from among the plurality of light emitting diodes 300 are arranged at a distance from (e.g., are spaced from) the first electrode 201 and the second electrode 202. Accordingly, all or substantially all of the plurality of light emitting diodes 300 arranged between the first electrode 201 and the second electrode 202 emit light even though some of the plurality of light emitting diodes 300 arranged between the first electrode 201 and the second electrode 202 are separated from the first electrode 201 or the second electrode 202 during the manufacturing process (e.g., are not adequately or sufficiently aligned during the manufacturing process).

At least one insulation pattern is disposed between the first contact 600 and the second contact 700. For example, the insulation pattern 800 is provided on the plurality of light emitting diodes 300 and is disposed between the first contact 600 and the second contact 700.

The insulation pattern 800 contacts the first contact 600, the second contact 700, and the light emitting diodes 300. The insulation pattern 800 prevents a short circuit between the first contact 600 and the second contact 700.

In some embodiments, the insulation pattern 800 is provided as a single layer and completely covers the first electrode 201.

The insulation pattern 800 includes a material selected from an organic material and an inorganic material.

In the light emitting display according to the above-described exemplary embodiment, the first contact 600 directly connects the first light emitting diodes 301 and the first electrode 201 to ensure that the first light emitting diodes 301 are not separated from the substrate 100.

For example, because the plurality of light emitting diodes 300 are not separated from the first electrode 201 and the second electrode 202 during the manufacturing process, the number of light emitting diodes 300 disposed between the first electrode 201 and the second electrode 202 can be increased.

In addition, in the light emitting device 1000 according to the exemplary embodiment, light irradiated from the plurality of light emitting diodes 300 in a direction toward the first protrusion 500 is reflected upwardly by the portion of the second electrode 202 that is protruded by the first protrusion 500, thereby improving the light emission efficiency of the plurality of light emitting diodes 300.

Further, in the light emitting device according to the exemplary embodiment, the plurality of light emitting diodes 300 are connected to the first electrode 201 and the second electrode 202 by the first contact 600 and the second contact 700 so that, even though some of the light emitting diodes 300 are arranged at a distance from (e.g., are spaced from) the first electrode 201 and the second electrode 202 during the manufacturing process, all or substantially all of the plurality of light emitting diodes 300 may be connected to the first electrode 201 and the second electrode 202.

For example, in the light emitting device (e.g., a light emitting diode display) 1000, although some of the plurality of light emitting diodes 300 arranged between the first electrode 201 and the second electrode 202 are disposed at a distance from the first electrode 201 and/or the second electrode 202, all or substantially all of the light emitting diodes 300 disposed between the first electrode 201 and the second electrode 202 may emit light.

In addition, in the light emitting device 1000 according to the exemplary embodiment, the first electrode 201 and the second electrode 202 between which the plurality of light emitting diodes 300 are arranged may not short-circuit with each other due to undesirable particles introduced during a process for forming the first contact 600.

This will be described in more detail with reference to a method of manufacturing a light emitting device according to another exemplary embodiment.

Hereinafter, referring to FIGS. 3-7, a light emitting device of the above-described exemplary embodiment may be manufactured by using a method of manufacturing a light emitting device according to another exemplary embodiment, but the present invention is not limited thereto. The above-described light emitting device may be manufactured by using the manufacturing method of a light emitting device according to another embodiment, and the present invention is not limited to the described embodiment.

Figure 3:
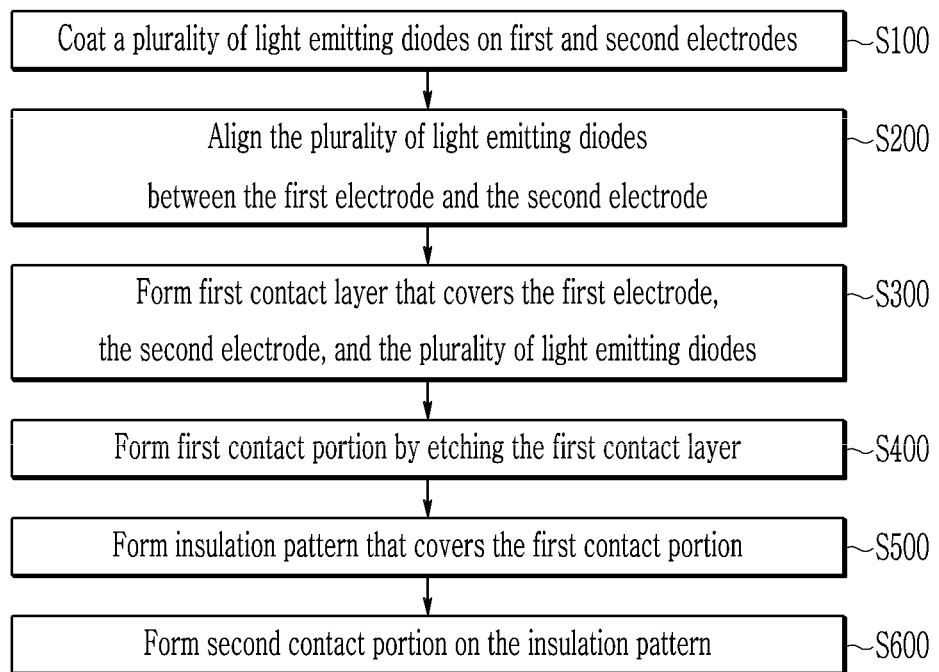
FIG. 3 is a flowchart of a method of manufacturing a light emitting device according to another exemplary embodiment.

FIG. 3 is a flowchart of a method of manufacturing a light emitting device according to another exemplary embodiment.

FIGS. 4-7 are cross-sectional views of the method of manufacturing the light emitting device illustrated in FIG. 3.

Figure 4:
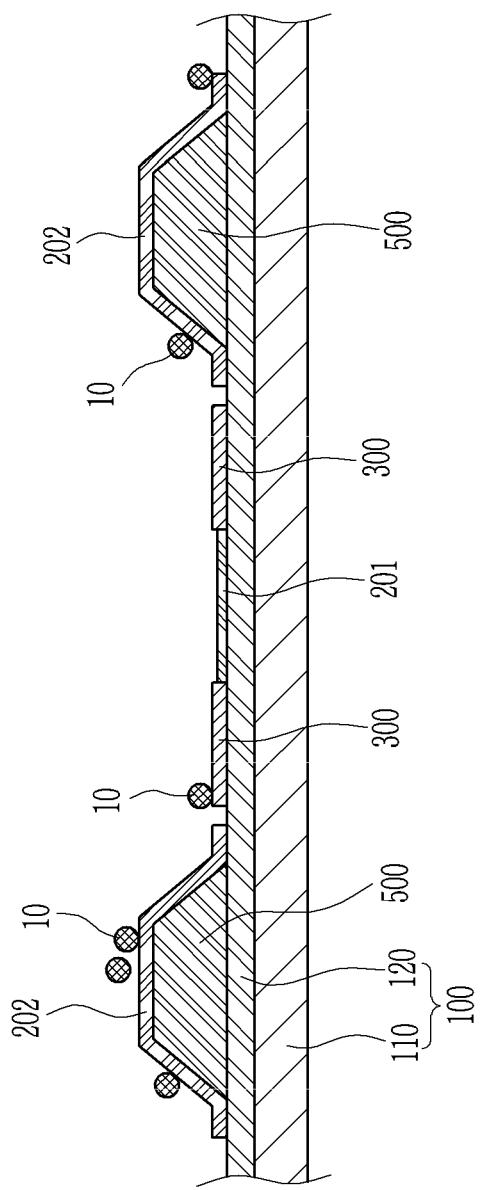
FIGS. 4-7 are cross-sectional views of the method of manufacturing the light emitting device according to exemplary embodiment illustrated in FIG. 3.
Figure 5:
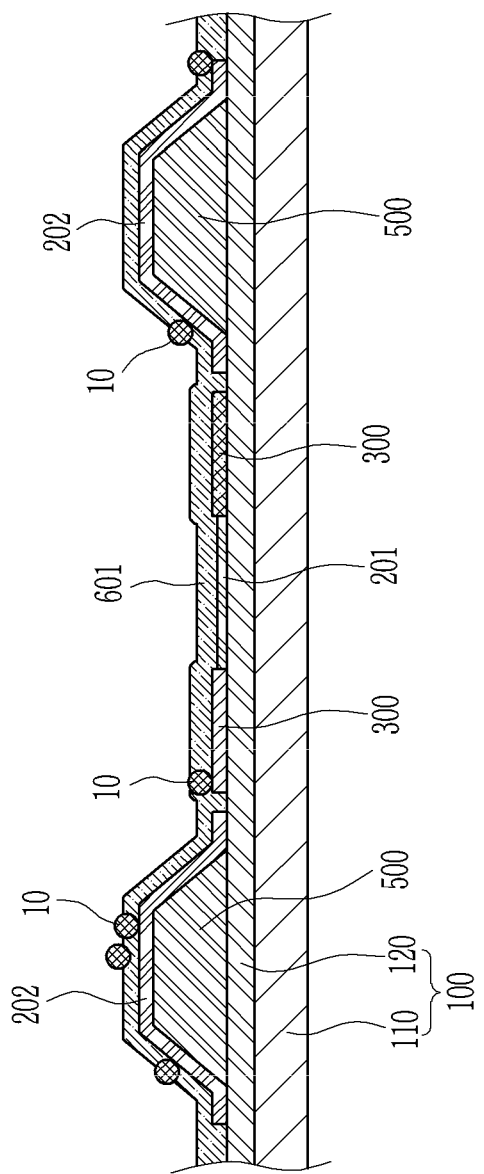

First, referring to FIGS. 3 and 4, a plurality of light emitting diodes 300 are coated on a first electrode 201 and second electrodes 202 of a substrate 100 (S100).

For example, the plurality of light emitting diodes 300 are coated on the first electrode 201 and the second electrodes 202 that extend in one direction while having a distance from each other (e.g., while being spaced from or separated from each other) on the substrate 100.

A first protrusion 500 is provided through a photolithography process on a substrate main body 110, on which a buffer layer 120 is formed, and the first electrode 201 and the second electrode 202 are formed through a photolithography process. In this embodiment, the second electrode 202 overlaps the first protrusion 500, and the first electrode 201 is disposed between neighboring second electrodes 202.

The plurality of light emitting diodes 300 are coated on the first electrode 201 and the second electrodes 202 in the form of ink or paste mixed with a solvent by a coating device, such as an inkjet printer. As will be described in more detail below, when the solvent evaporates, the plurality of light emitting diodes 300 are arranged on (e.g., dried or formed on) the first electrode 201 and the second electrodes 202. In some instances, particles 10 inadvertently mixed in the solvent or injected during the manufacturing process are also disposed on at least one of the first electrode 201, the second electrodes 202, and the plurality of light emitting diodes 300.

Next, the plurality of light emitting diodes 300 are arranged between the first electrode 201 and the second electrodes 202 (S200).

For example, an electromagnetic field is formed between the first electrode 201 and the second electrode 202 by applying power to the first electrode 201 and the second electrode 202. The plurality of light emitting diodes 300 are arranged between the first electrode 201 and the second electrodes 202 by the electromagnetic field formed between the first electrode 201 and the second electrodes 202.

Next, a first contact layer 601 is formed covering the first electrode 201, the second electrode 202, and the plurality of light emitting diodes 300 (S300).

For example, the first contact layer 601 is formed on the substrate 100 by using a deposition process or a coating process. The first contact layer 601 covers the first electrode 201, the second electrode 202, and the plurality of light emitting diodes 300.

In the illustrated embodiment, the first contact layer 601 contacts the first electrode 201, the second electrode 202, the plurality of light emitting diodes 300, and the particles 10. The particles 10 may be disposed inside of the first contact layer 610.

Figure 6:
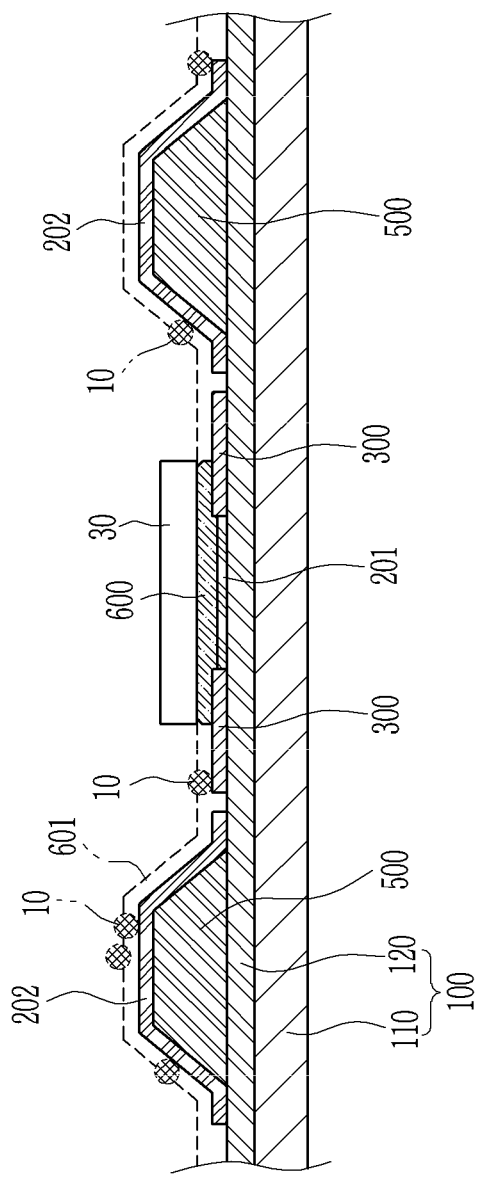

Next, referring to FIG. 6, the first contact 600 is formed by etching the first contact layer 601 (S400).

For example, the first contact layer 601 is etched by using a photomask 30 such that the first contact 600 that contacts the first electrode 201 and a first portion of the light emitting diode 300 is formed.

A photoresist layer is formed on the first contact layer 601, and the photoresist layer is exposed and developed by using an exposure mask to form the photomask 30 that overlaps the first electrode 201 and the first portion of the light emitting diode 300 on the first contact layer 610, and then, the first contact layer 601 is wet-etched or dry-etched by using the photomask 30 such that the first contact 600 that contacts the first electrode 201 and the first portion of the light emitting diode 300 is formed.

The particles 10 on the substrate 100 and contacting the first contact layer 601 are removed as the first contact layer 601 is etched.

In other embodiments, the substrate 100 may be cleaned. As the substrate 100 is cleaned, the particles 10 on the substrate 100 may be removed.

When the substrate 100 is cleaned, the plurality of light emitting diodes 300 may not be separated from between the first electrode 201 and the second electrode 202 because the first contact 600 contacts the first electrode 201 and the plurality of light emitting diodes 300.

In addition, because the particles 10 on the substrate 100 are removed, the first electrode 201 and the second electrode 202 may not be short-circuited with each other due to the particles 10.

Figure 7:
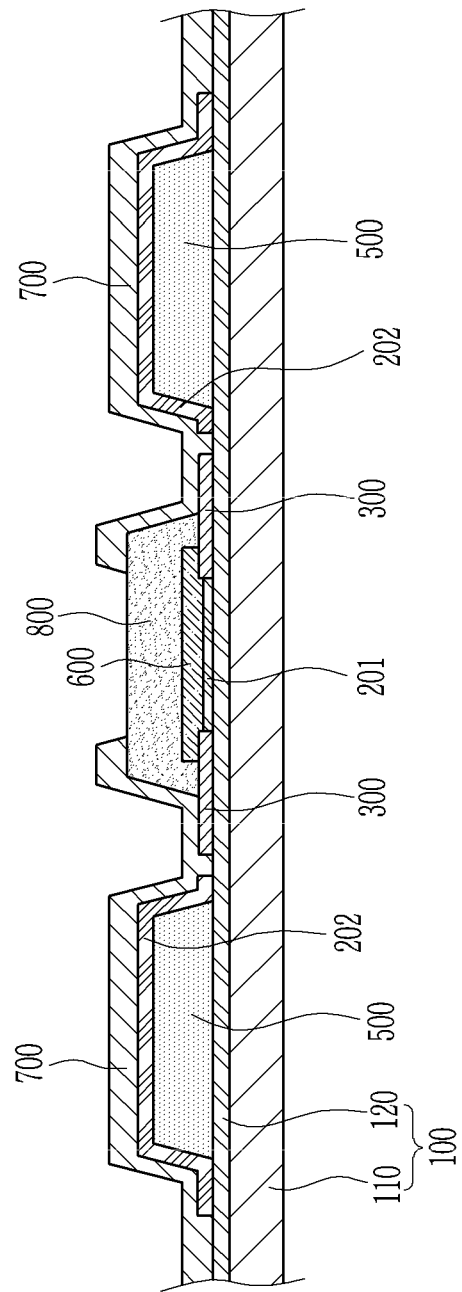

Next, referring to FIG. 7, an insulation pattern 800 that covers the first contact 600 is formed (S500).

For example, an insulation layer is formed on the first contact 600, and then, the insulation layer is etched by using a photolithography process to form the insulation pattern 800.

Next, a second contact 700 is formed on the insulation pattern 800 (S600).

For example, a conductive layer is formed on the insulation pattern 800, and the conductive layer is etched through a photolithography process to form the second contact 700.

According to the method of manufacturing the light emitting device of the above-described exemplary embodiment, the first contact 600 contacts the first electrode 201 and the plurality of light emitting diodes 300 when the substrate 100 is cleaned such that the plurality of light emitting diodes 300 are not separated between the first electrode 201 and the second electrode 202.

For example, because the plurality of light emitting diodes 300 are not separated from between the first electrode 201 and the second electrode 202 during the manufacturing process, the number of light emitting diodes 300 arranged between the first electrode 201 and the second electrode 202 is increased.

In addition, in the method of manufacturing the light emitting device according to the above-described exemplary embodiment, the particles 10 on the substrate 100 can be removed by forming the first contact 600 such that the first electrode 201 and the second electrode 202 may not be short-circuited with each other by the particles 10.

Further, in the method of manufacturing the light emitting diode display according to the exemplary embodiment, a first mask is used in the photolithography process for forming the first protrusion 500, a second mask is used in the photolithography process for forming the first electrode 201 and the second electrode 202, a third mask is used in the photolithography process for forming the first contact 600, a fourth mask is used in the photolithography process for forming the insulation pattern 800, and a fifth mask is used in the photolithography process for forming the second contact 700. That is, a total of five masks are used to manufacture the light emitting device.

Hereinafter, light emitting devices according to other exemplary embodiments will be described with reference to FIGS. 8-12.

Hereinafter, for ease of description, differences between the embodiments illustrated in FIGS. 8-12 and the above-described embodiments will be primarily described.

Figure 8:
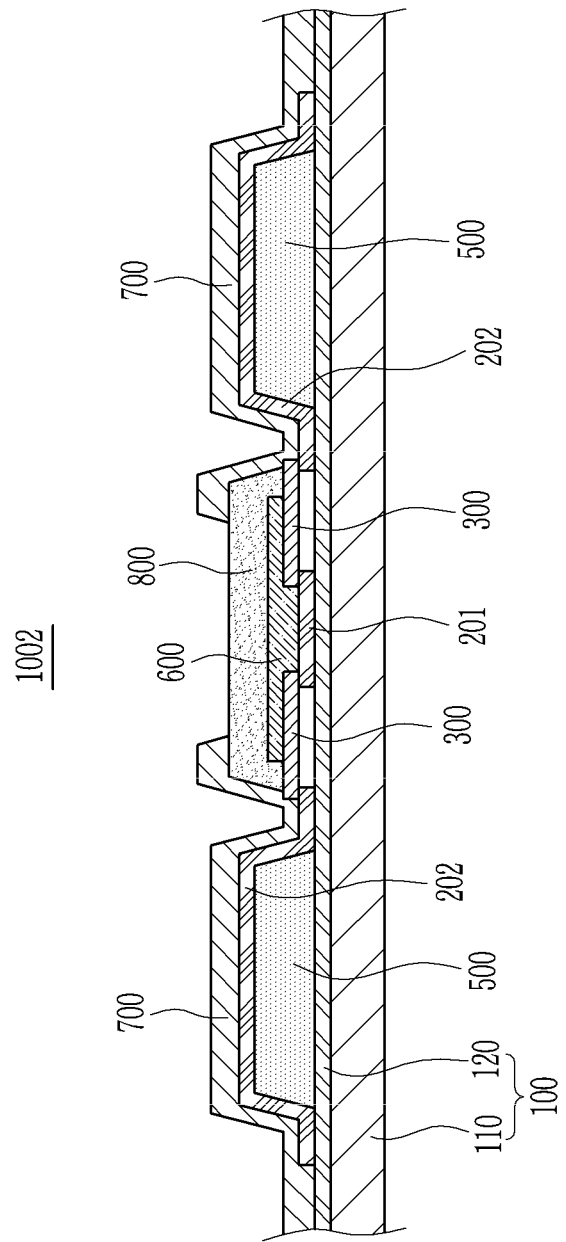
FIG. 8 is a cross-sectional view of a light emitting device according to another exemplary embodiment.

FIG. 8 is a cross-sectional view of a light emitting device.

Referring to FIG. 8, a light emitting device 1002 according to another exemplary embodiment includes a substrate 100, a first electrode 201, second electrodes 202, light emitting diodes 300, first protrusions 500, a first contact 600, second contacts 700, and an insulation pattern 800.

The light emitting diodes 300 are disposed between the first electrode 201 and the second electrodes 202. One end of each of the light emitting diodes 300 is disposed on the first electrode 201, and the other end thereof is disposed on one of the second electrodes 202.

The light emitting diode 300 is supported by the first electrode 201 and the second electrode 202. The light emitting diodes 300 are disposed apart from the substrate 100 and are spaced apart from the entire surface of the substrate 100.

Figure 9:
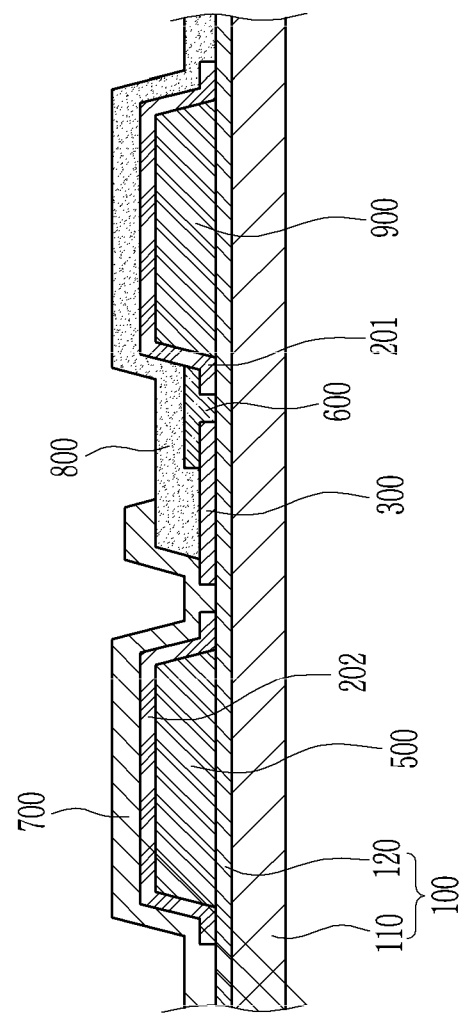
FIG. 9 is a cross-sectional view of a light emitting device according to still another exemplary embodiment.

FIG. 9 is a cross-sectional view of a light emitting device according to still another exemplary embodiment.

Referring to FIG. 9, a light emitting device 1003 according to another exemplary embodiment includes a substrate 100, a first electrode 201, a second electrode 202, a light emitting diode 300, a first protrusion 500, a first contact 600, a second contact 700, an insulation pattern 800, and a second protrusion (e.g., a second protrusion portion) 900.

The light emitting diode 300 is disposed between the first electrode 201 and the second electrode 202. The light emitting diode 300 contacts (e.g., is directly on) the substrate 100. The light emitting diode 300 contacts the first contact 600 and, thus, is connected to the first electrode 201, and contacts the second contact 700 and, thus, is connected to the second electrode 202 (e.g., the light emitting diode 300 is electrically connected to the first and second electrodes 201 and 202 via the first and second contacts 600 and 700, respectively).

The second protrusion 900 is disposed between the substrate 100 and the first electrode 201. A portion of the first electrode 201 on the second protrusion 900 is protruded upwardly from the substrate 100.

Light that is emitted from the light emitting diode 300 toward the first and second protrusions 500 and 900 may be reflected in the top side direction by the portion of the second electrode 202 that is protruded by the first protrusion 500 and the portion of the first electrode 201 that is protruded by the second protrusion 900. Accordingly, light emission efficiency of the light emitting diode 300 may be improved.

The insulation pattern 800 extends from the light emitting diode 300 over the first contact 600 to the first electrode 201.

The insulation pattern 800 completely covers the first contact 600 and the first electrode 201.

Figure 10:
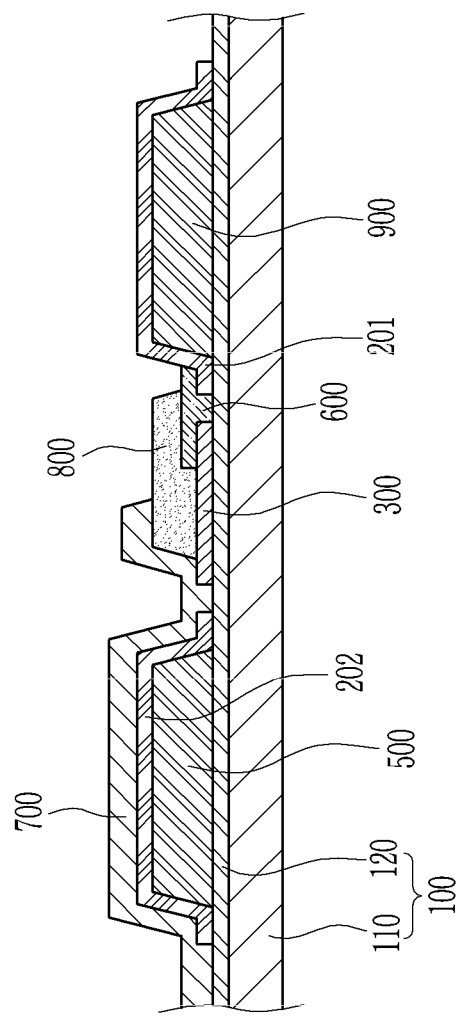
FIG. 10 is a cross-sectional view of a light emitting device according to still another exemplary embodiment.

FIG. 10 is a cross-sectional view of a light emitting device according to still another exemplary embodiment.

Referring to FIG. 10, a light emitting device 1004 according to another exemplary embodiment includes a substrate 100, a first electrode 201, a second electrode 202, a light emitting diode 300, a first protrusion 500, a first contact 600, a second contact 700, an insulation pattern 800, and a second protrusion 900.

The light emitting diode 300 is disposed between the first electrode 201 and the second electrode 202. The light emitting diode 300 contacts the substrate 100. The light emitting diode 300 contacts the first contact 600 and, thus, is connected to the first electrode 201, and contacts the second contact 700 and, thus, is connected to the second electrode 202.

The second protrusion 900 is disposed between the substrate 100 and the first electrode 201. A portion of the first electrode 201 on the second protrusion 900 is protruded upwardly from the substrate 100.

The insulation pattern 800 extends from the light emitting diode 300 to over a portion of the first contact 600.

The insulation pattern 800 covers some of the first contact 600 and some of the first electrode 201.

Figure 11:
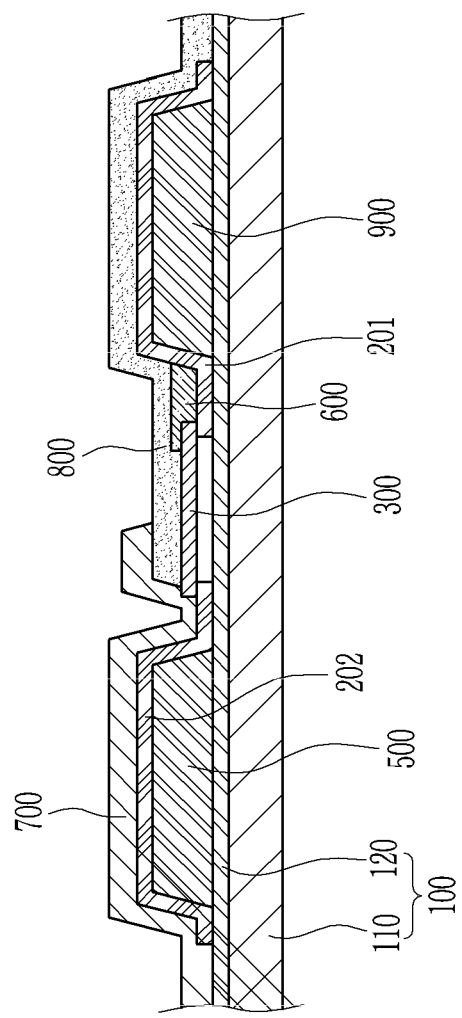
FIG. 11 is a cross-sectional view of a light emitting device according to still another exemplary embodiment.

FIG. 11 is a cross-sectional view of a light emitting device according to still another exemplary embodiment.

Referring to FIG. 11, a light emitting device 1005 according to another exemplary embodiment includes a substrate 100, a first electrode 201, a second electrode 202, a light emitting diode 300, a first protrusion 500, a first contact 600, a second contact 700, an insulation pattern 800, and a second protrusion 900.

The light emitting diode 300 is disposed between the first electrode 201 and the second electrode 202. The light emitting diode 300 contacts the substrate 100. One end of the light emitting diode 300 contacts both the first contact 600 and the first electrode 201, and the other end of the light emitting diode 300 contacts both the second contact 700 and the second electrode 202.

The second protrusion 900 is disposed between the substrate 100 and the first electrode 201. A portion of the first electrode 201 on the second protrusion 900 protrudes upwardly from the substrate 100.

The insulation pattern 800 extends from the light emitting diode 300 over the first contact 600 to the first electrode 201.

The insulation pattern 800 completely covers the first contact 600 and the first electrode 201.

The light emitting diode 300 is disposed between the first electrode 201 and the second electrode 202. One end of the light emitting diode 300 is disposed on the first electrode 201, and the other end thereof is disposed on the second electrode 202.

The light emitting diode 300 is supported by the first electrode 201 and the second electrode 202. The light emitting diode 300 is disposed apart from the substrate 100 and is spaced apart from the entire surface of the substrate 100.

Figure 12:
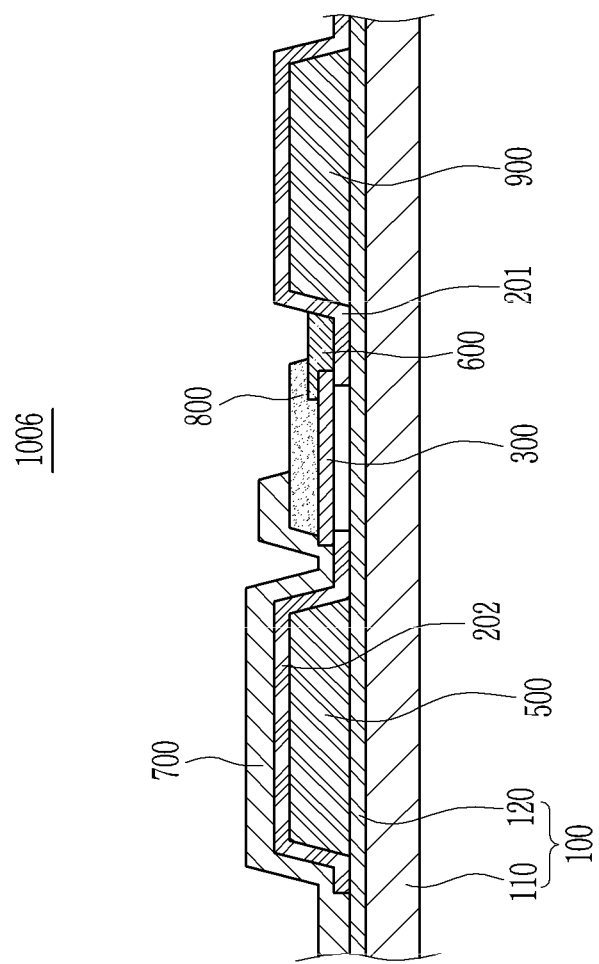
FIG. 12 is a cross-sectional view of a light emitting device according to still another exemplary embodiment.

FIG. 12 is a cross-sectional view of a light emitting device according to still another exemplary embodiment.

Referring to FIG. 12, a light emitting device 1006 according to another exemplary embodiment includes a substrate 100, a first electrode 201, a second electrode 202, a light emitting diode 300, a first protrusion 500, a first contact 600, a second contact 700, an insulation pattern 800, and a second protrusion 900.

The light emitting diode 300 is disposed between the first electrode 201 and the second electrode 202. The light emitting diode 300 contacts the substrate 100. One end of the light emitting diode 300 contacts both the first contact 600 and the first electrode 201, and the other end of the light emitting diode 300 contacts both the second contact 700 and the second electrode 202.

The second protrusion 900 is disposed between the substrate 100 and the first electrode 201. A portion of the first electrode 201 on the second protrusion 900 protrudes upwardly from the substrate 100.

The insulation pattern 800 extends from the light emitting diode 300 to cover a portion of the first contact 600.

The insulation pattern 800 covers some of the first contact 600 and some of the first electrode 201.

The light emitting diode 300 is disposed between the first electrode 201 and the second electrode 202. One end of the light emitting diode 300 is disposed on the first electrode 201, and the other end thereof is disposed on the second electrode 202.

The light emitting diode 300 is supported by the first electrode 201 and the second electrode 202. The light emitting diode 300 is disposed apart from the substrate 100 and is spaced apart from the entire surface of the substrate 100.

While the present invention has been described in connection with what is presently considered to be practical exemplary embodiments, it is to be understood that the present invention is not limited to the disclosed embodiments. The present invention is intended to cover various modifications and equivalent arrangements included within the spirit and scope of the appended claims and their equivalents.

What is claimed is:

1. A light emitting device comprising:
    a substrate;
    a first electrode and a second electrode on the substrate and spaced apart from each other;
    a first protrusion between the substrate and the second electrode;
    a light emitting diode between the first electrode and the second electrode, the light emitting diode being electrically connected to the first electrode and the second electrode;
    an insulation pattern on the light emitting diode;
    a first contact contacting the first electrode and a first portion of the light emitting diode; and
    a second contact contacting a second portion of the light emitting diode and the second electrode,
    wherein the first electrode and the second electrode do not contact the light emitting diode,
    wherein at least a portion of the second contact is disposed on a side surface of the insulation pattern, and
    wherein the second contact comprises a first portion directly contacting the second electrode, a second portion directly contacting the second portion of the light emitting diode, and a third portion directly contacting the side surface of the insulation pattern.

2. The light emitting device of claim 1, wherein the first portion of the second contact overlaps the first protrusion.

3. The light emitting device of claim 2, wherein the second electrode includes a lower surface facing the substrate and an upper surface opposite the lower surface,
    wherein the first protrusion is between the substrate and the lower surface of the second electrode, and
    wherein the first portion of the second contact directly contacts the upper surface of the second electrode.

4. The light emitting device of claim 1, wherein the insulation pattern comprises an organic material.

5. The light emitting device of claim 1,
    wherein the insulation pattern includes a lower surface facing the substrate, an upper surface opposite to the lower surface and the side surface connected to the lower surface and the upper surface, and
    wherein the upper surface of the insulation pattern directly contacts the second contact.

6. The light emitting device of claim 1, wherein the light emitting diode includes a side surface facing the first protrusion, and
    wherein the second portion of the second contact directly contacts the side surface of the light emitting diode.

7. The light emitting device of claim 1, further comprising a second protrusion between the substrate and the first electrode.

8. The light emitting device of claim 1, wherein the light emitting diode is laterally offset from the first electrode and the second electrode in a direction parallel to an upper surface of the substrate.

9. A light emitting device comprising:
    a substrate;
    a first electrode and a second electrode on the substrate and spaced apart from each other;
    a light emitting diode between the first electrode and the second electrode, the light emitting diode being electrically connected to the first electrode and the second electrode, the light emitting diode including a lower surface facing the substrate, an upper surface opposite the lower surface, and a side surface between the lower surface and the upper surface;
    a first contact contacting the first electrode and a first portion of the light emitting diode; and
    a second contact contacting the second electrode and directly contacting the side surface of the light emitting diode,
    wherein the first electrode and the second electrode do not contact the light emitting diode, and
    wherein the side surface of the light emitting diode faces the second electrode.

10. The light emitting device of claim 9, further comprising an insulation pattern on the light emitting diode,
    wherein a portion of the second contact directly contacts a side surface of the insulation pattern.

11. The light emitting device of claim 10, wherein the insulation pattern comprises an organic material.

12. The light emitting device of claim 9, further comprising a first protrusion between the substrate and the second electrode,
- wherein a portion of the second contact overlaps the first protrusion, and
- wherein the portion of the second contact directly contacts the second electrode.

13. A method of manufacturing a light emitting device, the method comprising:
- forming a first electrode on a substrate;
- forming a first protrusion on the substrate;
- forming a second electrode on the first protrusion, the first electrode and the second electrode being spaced apart from each other on the substrate;
- coating a light emitting diode on the substrate;
- aligning the light emitting diode between the first electrode and the second electrode by forming an electric field between the first electrode and the second electrode;
- forming a first contact layer covering the first electrode, the second electrode, and the light emitting diode;
- forming a first contact contacting the first electrode and a first portion of the light emitting diode by etching the first contact layer using a mask;
- forming a second contact contacting the second electrode and a second portion of the light emitting diode; and
- forming an insulation pattern between the first contact and the second contact, wherein the first electrode and the second electrode do not contact the light emitting diode,
- wherein at least a portion of the second contact is disposed on a side surface of the insulation pattern, and
- wherein the second contact comprises a first portion directly contacting the second electrode, a second portion directly contacting the second portion of the light emitting diode, and a third portion directly contacting the side surface of the insulation pattern.

14. The method of manufacturing the light emitting device of claim 13, wherein the forming of the first contact comprises removing particles formed on the substrate and contacting the first contact layer.

* * * * *